(12) United States Patent
Kudela et al.

(10) Patent No.: US 9,397,380 B2
(45) Date of Patent: Jul. 19, 2016

(54) GUIDED WAVE APPLICATOR WITH NON-GASEOUS DIELECTRIC FOR PLASMA CHAMBER

(75) Inventors: Jozef Kudela, San Jose, CA (US); Tsutomu Tanaka, Santa Clara, CA (US); Carl A. Sorensen, Morgan Hill, CA (US); Suhail Anwar, San Jose, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 741 days.

(21) Appl. No.: 13/360,652

(22) Filed: Jan. 27, 2012

(65) Prior Publication Data

US 2013/0126331 A1    May 23, 2013

Related U.S. Application Data

(60) Provisional application No. 61/437,007, filed on Jan. 28, 2011.

(51) Int. Cl.
*H01P 3/16* (2006.01)
*H01L 21/02* (2006.01)
(Continued)

(52) U.S. Cl.
CPC .............. *H01P 3/16* (2013.01); *H01J 37/32229* (2013.01); *H01L 21/02* (2013.01); *H01L 21/02104* (2013.01); *H05H 1/46* (2013.01); *H05H 2001/4622* (2013.01)

(58) Field of Classification Search
CPC ................ H01J 37/32229; H05H 1/46; H05H 2001/4622; H01P 3/16; H01P 3/14; H01L 21/02104; H01L 21/02

USPC ............. 204/157.15; 118/723 MW; 333/239; 156/345.41
See application file for complete search history.

(56) References Cited

U.S. PATENT DOCUMENTS 3,758,879 A * 9/1973 Beguin et al. .................. 333/111
5,003,152 A * 3/1991 Matsuo et al. ................. 219/750
(Continued)

FOREIGN PATENT DOCUMENTS

JP   2003-86581 A   3/2003
JP   4017796 B2   12/2007

OTHER PUBLICATIONS

F. Werner et al, "Slot antenna 2.45 GHz microwave plasma source", Plasma Sources Sci. Technol., vol. 3, No. 4, p. 473, Abstract only (Nov. 1994).
(Continued)

*Primary Examiner* — Keith Hendricks
*Assistant Examiner* — Colleen M Raphael
(74) *Attorney, Agent, or Firm* — Robert J. Stern

(57) ABSTRACT

A guided wave applicator comprising two electrically conductive waveguide walls and a waveguide dielectric. The volume of the waveguide dielectric is composed of non-gaseous dielectric material and is positioned between the two waveguide walls. The waveguide dielectric includes first and second longitudinal ends and includes first, second, third and fourth sides extending longitudinally between the two longitudinal ends. The first waveguide wall is positioned so that it covers the first side of the waveguide dielectric, and the second waveguide wall is positioned so that it covers the second side of the waveguide dielectric. In operation, electrical power can be supplied to one or both longitudinal ends of the waveguide dielectric, whereby the power can be coupled to a plasma through the exposed sides of the waveguide dielectric.

26 Claims, 6 Drawing Sheets

(51) Int. Cl.
*H05H 1/46* (2006.01)
*H01J 37/32* (2006.01)

(56) References Cited

U.S. PATENT DOCUMENTS

| | | | | |
|---|---|---|---|---|
| 5,107,231 | A | * | 4/1992 | Knox .......................... 333/109 |
| 5,370,765 | A | | 12/1994 | Dandl |
| 5,528,208 | A | * | 6/1996 | Kobayashi .................... 333/241 |
| 5,646,489 | A | * | 7/1997 | Kakehi et al. ......... 118/723 MW |
| 5,843,236 | A | * | 12/1998 | Yoshiki ............. H01J 37/32192 |
| | | | | 118/723 ME |
| 5,902,404 | A | * | 5/1999 | Fong et al. ............ 118/723 MW |
| 6,084,356 | A | * | 7/2000 | Seki et al. ............. 118/723 MA |
| 6,211,621 | B1 | | 4/2001 | Caughran |
| 6,271,148 | B1 | | 8/2001 | Kao |
| 6,298,806 | B1 | * | 10/2001 | Moisan et al. ........ 118/723 MW |
| 6,558,635 | B2 | * | 5/2003 | Minaee et al. ................. 219/678 |
| 6,657,151 | B2 | * | 12/2003 | Ishii et al. ..................... 219/747 |
| 6,940,036 | B2 | * | 9/2005 | Bayer et al. .................... 219/680 |
| 2005/0040918 | A1 | * | 2/2005 | Kildal .......................... 333/239 |
| 2006/0238132 | A1 | * | 10/2006 | Kitamura et al. ........ 315/111.21 |
| 2007/0034157 | A1 | * | 2/2007 | Nakata et al. ......... 118/723 MW |
| 2007/0102403 | A1 | * | 5/2007 | Ohmi et al. .............. 219/121.36 |
| 2007/0289533 | A1 | * | 12/2007 | Horiguchi ............. 118/723 MW |
| 2008/0093358 | A1 | * | 4/2008 | Lee et al. ....................... 219/686 |
| 2009/0242131 | A1 | | 10/2009 | Mai |
| 2010/0296977 | A1 | * | 11/2010 | Hancock ....................... 422/186 |
| 2011/0121736 | A1 | * | 5/2011 | Hirayama et al. ....... 315/111.41 |
| 2012/0146881 | A1 | * | 6/2012 | McKinzie, III ....... H01P 1/2005 |
| | | | | 333/239 |
| 2012/0217874 | A1 | | 8/2012 | Kudela |

OTHER PUBLICATIONS

Y. Shiraki et al., "R&D of new surface wave produced plasma in VHF band", Proc. 15th Symposium on Plasma Processing, pp. 202-205 (Jan. 1998).

E. Rauchle, "Duo-plasmaline, a surface wave sustained linearly extended discharge", J. Phys. IV France, vol. 8, pp. Pr7-99-Pr7-108 (1998).

S. Raoux et al., "Remote microwave plasma source for cleaning chemical deposition chambers: Technology for reducing global warming gas emissions", J Vac Sci Technol B, vol. 17 (2), pp. 477-485 (Mar./Apr. 1999).

\* cited by examiner

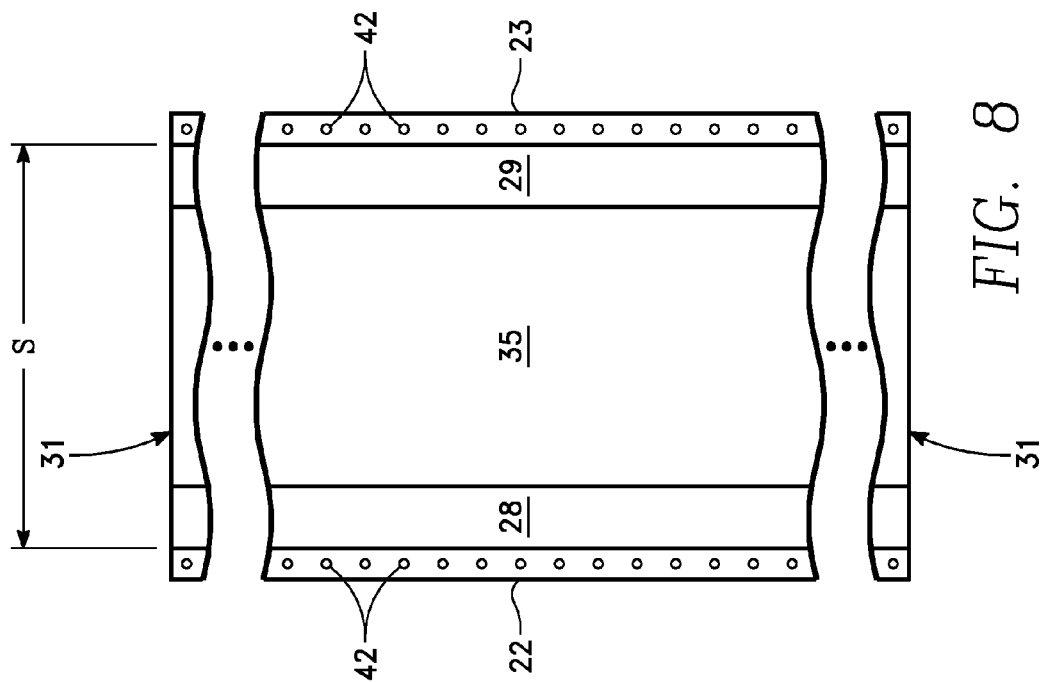
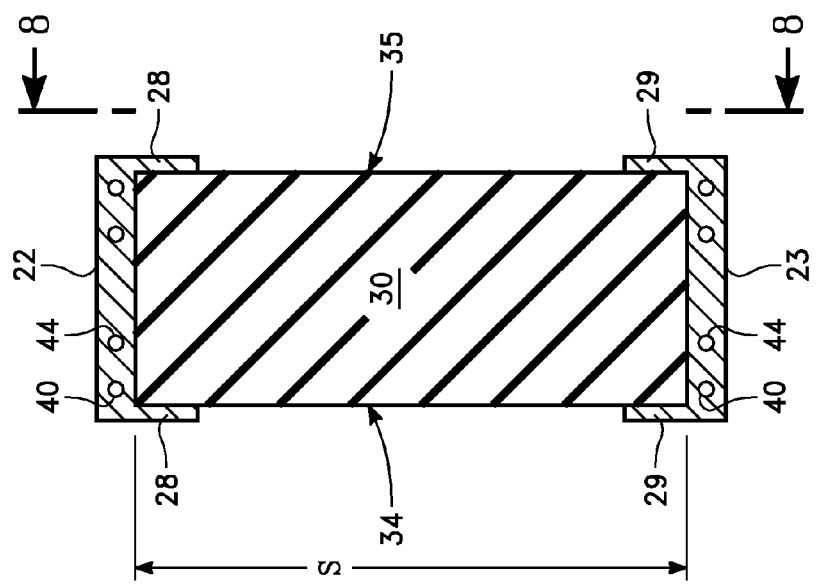

GUIDED WAVE APPLICATOR WITH NON-GASEOUS DIELECTRIC FOR PLASMA CHAMBER

CROSS REFERENCE TO RELATED APPLICATION

This patent application claims the benefit of U.S. Provisional Application No. 61/437,007 filed Jan. 28, 2011.

TECHNICAL FIELD

The invention relates generally to guided wave applicator methods and apparatus useful for forming a plasma discharge in a process chamber for fabricating electronic devices such as semiconductors, displays and solar cells. The invention relates more specifically to a guided wave applicator comprising a non-gaseous dielectric having two opposite sides that are not covered by a metal waveguide wall.

BACKGROUND ART

Plasma chambers commonly are used to perform processes for fabricating electronic devices such as semiconductors, displays and solar cells. Such plasma fabrication processes include chemical vapor deposition of semiconductor, conductor or dielectric layers on the surface of a workpiece or etching of selected portions of such layers on the workpiece surface.

A plasma commonly is formed in a plasma chamber by coupling electrical power from an electrical power source to a gas so as to excite the gas to a plasma state. If the electrical power source is a microwave power source, the power commonly is transmitted through a microwave waveguide connected between the power source and the plasma chamber.

In some designs, the microwave waveguide terminates in a dielectric window in the wall of the plasma chamber. This type of design typically couples power only to the plasma adjacent the dielectric window in the chamber wall, relying on diffusion to extend the plasma to the center of the chamber. Consequently, a disadvantage of this type of design is that it is difficult to achieve good spatial uniformity of the plasma density in a large chamber because the plasma density tends to be lower near the center of the chamber than near the surrounding chamber wall.

Other proposed designs differ from the above by extending the microwave waveguide into the interior of the plasma chamber. The waveguide has a hollow interior enclosed by a wall. Either a portion or all of the waveguide wall within the plasma chamber consists of a dielectric window. (The remaining portion typically is metal.) Microwave power is coupled to the plasma by means of a guided wave along the surface of the dielectric window. The section of the waveguide having a dielectric window commonly is referred to as a "microwave applicator".

In the latter type of design, the interior of the waveguide cannot be maintained at the high vacuum of the plasma chamber, or else a plasma would be formed inside the waveguide, in which case the waveguide would cease functioning as a waveguide because plasma is a conductor rather than a dielectric. To prevent such plasma from forming, the interior of the waveguide must be filled with air (or other gas) at atmospheric or near-atmospheric pressure. This requires the dielectric window to provide a vacuum-tight gas seal so as to sustain the pressure differential between the air at atmospheric pressure within the waveguide and the process gases at high vacuum (i.e., very low pressure) within the plasma chamber.

A disadvantage of this type of design is that it is difficult to scale up to plasma chambers for processing workpieces that are several meters wide because it is difficult and expensive to manufacture a dielectric wall that is several meters long, can sustain the aforesaid pressure differential over its entire surface, and can withstand thermal shock from the high temperatures within a plasma chamber.

Some of the foregoing designs suffer the additional shortcoming of transmitting microwave power through a dielectric window facing only one direction. This can impair the spatial uniformity of the plasma produced within the plasma chamber.

SUMMARY OF THE INVENTION

In a first apparatus aspect and a first method aspect, the invention is a guided wave applicator apparatus and method that includes two electrically conductive waveguide walls and a waveguide dielectric.

The volume of the waveguide dielectric is composed of non-gaseous dielectric material and is positioned between the two waveguide walls. Optionally, the waveguide dielectric can be monolithic, or it can be divided into multiple segments that need not be connected together. The waveguide dielectric includes first and second longitudinal ends and includes first, second, third and fourth sides extending longitudinally between the two longitudinal ends.

The first waveguide wall is positioned so that it covers the first side of the waveguide dielectric, and the second waveguide wall is positioned so that it covers the second side of the waveguide dielectric. A portion of each of the third and fourth sides of the waveguide dielectric (referred to herein as the "exposed sides") is not covered by the waveguide walls. Preferably such portion is at least half the surface area of the exposed sides of the waveguide dielectric.

In second apparatus aspect, the invention is a plasma chamber that includes the aforesaid guided wave applicator within a plasma chamber. In a second method aspect, the invention is a method of coupling electrical power to a plasma within such plasma chamber.

In operation, an electrical power generator, such as a microwave generator, can be coupled to either or both longitudinal ends of the waveguide dielectric so as to supply electrical power to the guided wave applicator.

In operation, the waveguide dielectric is directly exposed to a process gas within the plasma chamber. Plasma adjacent the exposed sides of the waveguide dielectric functions similarly to a conductive wall of a waveguide. Unlike a metal wall, however, the exposed sides of the waveguide dielectric enable electrical power to be coupled from the guided wave applicator to the plasma.

Advantageously, because the volume of the waveguide dielectric is composed of non-gaseous material, there is no need to provide a vacuum seal or to maintain a pressure differential between the interior of the guided wave applicator and the low pressure interior of the plasma chamber. Consequently, the guided wave applicator readily and inexpensively can be fabricated with as great a length as desired for use in fabricating large electronic devices such as solar panels or flat panel displays.

Preferably one or more of the guided wave applicators are positioned between two workpieces within the plasma chamber.

Preferably a plurality of the guided wave applicators are positioned parallel to each other and to one or more workpieces within the plasma chamber.

The plasma chamber of the invention can be a process chamber within which an electronic workpiece (such as semiconductors, displays and solar cells) is fabricated. Alternatively, the plasma chamber of the invention can be a remote plasma source used for forming a plasma that is conveyed (i.e., flowed) to a process chamber in which the electronic workpiece is fabricated. In any event, the guided wave applicator can be used to form a plasma for purposes of processing an electronic workpiece or for purposes of cleaning a chamber in which such workpiece is processed.

BRIEF DESCRIPTION OF THE DRAWINGS

FIGS. 7 and 8 are views similar to FIGS. 2 and 3, respectively, of an alternative embodiment of a guided wave applicator whose waveguide walls include flanges that partially cover the exposed sides of the waveguide dielectric.

BEST MODE FOR CARRYING OUT THE INVENTION

1. Basic Features of Invention

Figure 1:
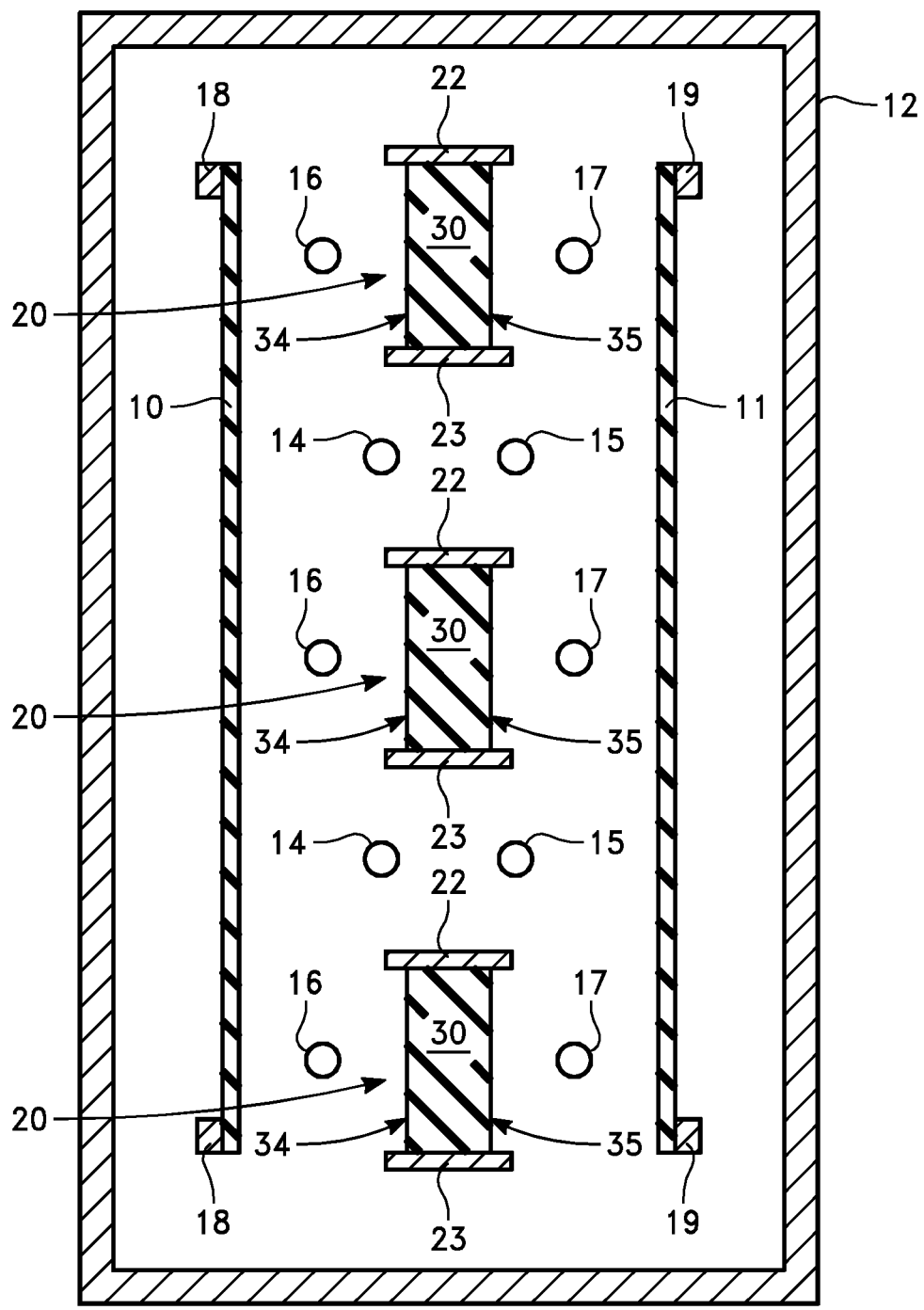
FIG. 1 is a partially schematic, sectional view of a plasma chamber according to the invention, wherein the view is taken from a horizontal section plane.

FIG. 1 is a sectional top view of one embodiment of a plasma chamber according to the invention.

In the FIG. 1 embodiment, first and second workpiece supports 18, 19 respectively support first and second flat workpieces at respective workpiece positions 10, 11 in a vertical orientation within a plasma chamber. In alternative embodiments, the workpieces can be oriented horizontally or can be tilted at an acute angle. Examples of workpieces that can be processed in the plasma chamber are a glass substrate for fabrication of flat panel displays or a silicon substrate for fabrication of semiconductor circuits or solar cells.

The plasma chamber has a chamber wall 12 that is electrically grounded and that surrounds the chamber interior. One or more process gases are supplied to the interior of the plasma chamber through one or more process gas conduits 14-17. In the illustrated embodiment, the process gas conduits are vertically oriented cylindrical tubes positioned between the two workpieces. Each process gas conduit preferably has a plurality of gas outlet holes distributed along its length. In the illustrated embodiment, a first set of process gas conduits 14, 16 has gas outlet holes facing the first workpiece position 10, and a second set of process gas conduits 15, 17 has gas outlet holes facing the second workpiece position 11.

Figure 6:
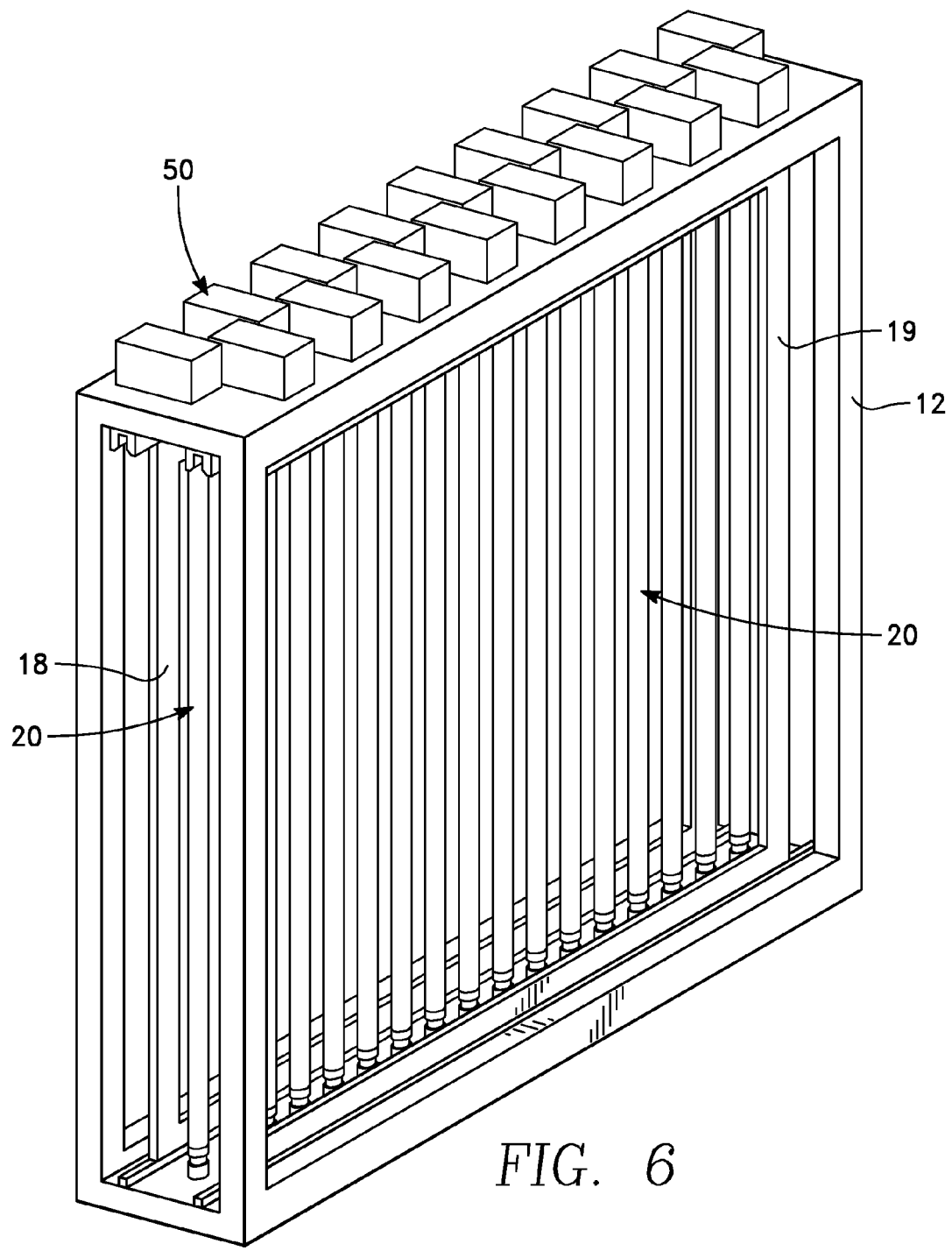
FIG. 6 is a perspective view of two workpiece supports and an array of guided wave applicators according to an alternative embodiment of the invention.

At least one novel guided wave applicator 20 couples electrical power, typically microwave power, to the one or more process gases within the plasma chamber so as to excite the process gases to a plasma state. FIG. 1 shows an embodiment having three such guided wave applicators 20. FIG. 6 shows an alternative embodiment having seventeen guided wave applicators 20.

In order to achieve an equal plasma density adjacent the two workpiece positions 10, 11, each guided wave applicator preferably is positioned midway between the two workpieces. Specifically, the guided wave applicators preferably are positioned within a geometric plane that is midway between the two workpieces. In order to distribute the guided wave applicators along both orthogonal dimensions of such plane, the guided wave applicators preferably are positioned so that their respective longitudinal axes are mutually parallel, and they are spaced apart along a dimension perpendicular to their respective longitudinal axes, as shown in FIGS. 1 and 6.

Each guided wave applicator 20 has a waveguide dielectric 30 whose volume is composed of non-gaseous dielectric material, preferably a solid dielectric material such as ceramic. (We use the term "volume" to mean the volume enclosed by the outermost boundary of the waveguide dielectric.) Accordingly, the waveguide dielectric is not merely a tube or shell surrounding an air-filled interior, as in some prior art designs. Advantages of the invention over such prior art designs are explained below in the section "2. Operation". The waveguide dielectric 30 can be monolithic, or else it can be divided into multiple segments 30a, 30b, 30c, et seq. that need not be connected together, as explained below in the section "4. Reducing Thermal Stress".

The longest dimension of the waveguide dielectric is its longitudinal dimension that extends between first and second opposite longitudinal ends 31 of the waveguide dielectric. (The longitudinal dimension of the waveguide dielectric is perpendicular to the page in FIGS. 1 and 2, and it extends vertically in the plane of the page in FIGS. 3-5.) When we refer to a transverse width of the waveguide dielectric or a segment thereof, we mean a width along a dimension that is perpendicular to the aforesaid longitudinal dimension of the waveguide dielectric. When we refer to a transverse cross section of the waveguide dielectric or a segment thereof, we mean a cross section that is perpendicular to the aforesaid longitudinal dimension of the waveguide dielectric.

As shown in FIGS. 2-5, the waveguide dielectric 30 includes four sides 32-35 extending longitudinally between the two longitudinal ends 31. (The longitudinal ends 31 of the waveguide dielectric are not shown in FIGS. 1 and 2 because they are respectively above and below the page.) The four longitudinally-extending sides consist of first and second "covered" sides 32, 33 and first and second "exposed" sides 34, 35. The two covered sides 32, 33 are opposite each other, and the two exposed sides 34, 35 are opposite each other.

As will be explained below, we refer to the four longitudinally-extending sides of the waveguide dielectric as "covered" and "exposed" because the respective covered sides 32, 33 are covered by the respective waveguide walls 22, 23, whereas the exposed sides 34, 35 are at least partially exposed, i.e., at least partially not covered by the waveguide walls.

Preferably but optionally, each of the exposed sides 34, 35 is wider than each of the covered sides 32, 33 of the waveguide dielectric. In other words, preferably each of the exposed sides has a greater transverse width than each of the covered sides. Preferably but optionally, each of the exposed sides has the same transverse width S, and each of the covered sides has the same transverse width D, wherein S preferably is greater than D.

Figure 2:
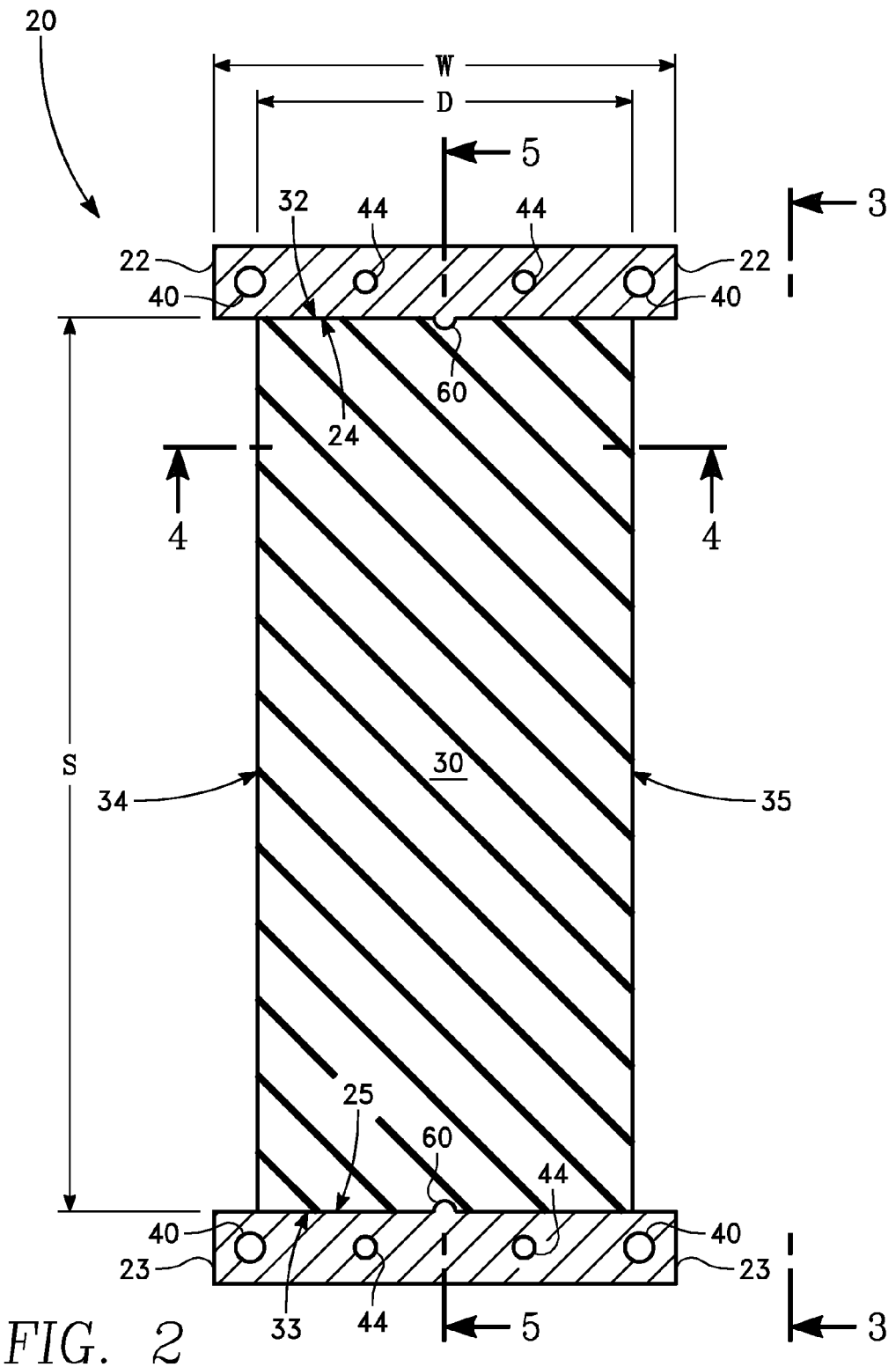
FIG. 2 is a detail of one of the guided wave applicators of FIG. 1, viewed from the same section plane as FIG. 1.

In the embodiment shown in FIG. 2, the four sides 32-35 are flat, and the waveguide dielectric 30 is shaped as a parallelepiped. In other words, in the illustrated embodiment the waveguide dielectric has a transverse cross section in the shape of a rectangle having two relatively narrow covered sides 32, 33 of width D and two relatively wide exposed sides 34, 35 of width S. More generally, any or all of the four sides 32-35 can be curved rather than flat, and the waveguide dielectric need not be shaped as a parallelepiped and need not have a rectangular cross section.

Each guided wave applicator 20 further includes first and second electrically conductive waveguide walls 22, 23. The waveguide walls typically are metal, such as aluminum. Each of the two waveguide walls 22, 23 has a surface referred to as its respective inward-facing surface 24, 25. The respective inward-facing surfaces 24, 25 of two waveguide walls 22, 23 are mutually facing, i.e., the two inward-facing surfaces 24, 25 face each other.

Each respective inward-facing surface 24, 25 covers a respective covered side 32, 33 of the waveguide dielectric 30. In other words, the inward-facing surface 24 of the first waveguide wall 22 covers the first covered side 32 of the waveguide dielectric. Likewise, the inward-facing surface 25 of the second waveguide wall 23 covers the second covered side 33 of the waveguide dielectric.

Optionally, the inward-facing surface 24, 25 of each waveguide wall 22, 23, respectively, can extend beyond the edge of the respective covered side 32, 33 of the waveguide dielectric 30. In other words, each waveguide wall 22, 23 has a width W that is greater than or equal to the width D of the covered sides 32, 33 of the waveguide dielectric.

The inward-facing surfaces 24, 25 of the waveguide walls 22, 23 can be flat or curved. In the embodiment shown in FIG. 2, the inward-facing surfaces 24, 25 are flat and parallel.

One or both waveguide walls optionally can be mounted within the plasma chamber by means of one or more support members (not shown) connected between the waveguide wall and the chamber wall 12. The support members can be electrically conductive, or they can be composed of dielectric material such as ceramic if it is desired to insulate the waveguide walls from the electrically grounded chamber wall.

A portion of each of the two exposed sides 34, 35 of the waveguide dielectric is not covered by the waveguide walls 22, 23. However, the term "exposed side" is not intended to imply that the exposed sides are completely exposed. At least a portion of each exposed side may be covered by the waveguide walls. For example, FIGS. 1-5 illustrate embodiments in which no portion of the exposed sides 34, 35 is covered by the waveguide walls. FIGS. 7 and 8 illustrate an alternative embodiment in which the waveguide walls cover a substantial portion of each of the exposed sides 34, 35. Preferably the portion of each of the two exposed sides 34, 35 of the waveguide dielectric that is not covered by the waveguide walls is at least half the surface area of each of the exposed sides 34, 35. Furthermore, preferably at least half the surface area of each of the two exposed sides 34, is not covered by any other electrically conductive solid object.

2. Operation

In operation, one or both longitudinal ends 31 of the waveguide dielectric 30 of each guided wave applicator 20 is coupled to receive electrical power from a conventional electrical power generator, typically a microwave generator. FIG. 6 shows a planar array of seventeen guided wave applicators 20, each of which is connected to a conventional microwave generator 50 at its upper and lower longitudinal ends 31. (The microwave generators connected to the lower end of each of the guided wave applicators are not visible in FIG. 6, but they are connected like the microwave generators shown at the upper ends.)

In embodiments in which both longitudinal ends 31 of the waveguide dielectric of a guided wave applicator 20 are coupled to a microwave generator, a single microwave generator can be coupled via conventional microwave waveguides to both longitudinal ends, or else two distinct microwave generators can be coupled to the two respective longitudinal ends.

Multiple microwave generators can be respectively coupled to multiple guided wave applicators 20, or else a single microwave generator can be coupled to multiple guided wave applicators. In the latter case, multiple guided wave applicators can be electrically connected in series, in parallel, or in a combination of both series and parallel.

While we believe the operating principles of the invention are as described herein, it must be emphasized that the invention is not limited to any specific theory of operation.

We will first explain the operation of the guided wave applicator 20 after a plasma already has been formed within the plasma chamber.

Because the body of a plasma is electrically conductive, the plasma adjacent the exposed sides 34, 35 of the waveguide dielectric 30 functions similar to a conductive wall that is parallel to and adjacent to the exposed sides of the waveguide dielectric. The microwave power supplied to one or both longitudinal ends 31 of the waveguide dielectric will propagate through the guided wave applicator 20 as a guided wave as it would through a rectangular waveguide whose narrow walls are the waveguide walls 22, 23 and whose wide walls are the boundary between the plasma and the exposed sides 34, 35 of the waveguide dielectric.

However, unlike a metal wall of a waveguide, the waveguide dielectric 30 functions to transfer microwave power from the guided wave applicator to the plasma adjacent the exposed sides 34, 35 of the waveguide dielectric 30. This transfer of power from the guided wave applicator to the plasma sustains the plasma.

If there is no plasma in the plasma chamber when microwave power is first supplied to the guided wave applicator 20, microwave power initially will radiate into the plasma chamber from the end 31 of the waveguide dielectric 30 of the guided wave applicator that is connected to the microwave generator. (If both longitudinal ends 31 of the waveguide dielectric of the guided wave applicator are connected to a microwave generator, then microwave power initially will radiate into the plasma chamber from both longitudinal ends 31 of the waveguide dielectric.) This will initiate excitation of the process gas within the plasma chamber into a plasma state. As a plasma forms, the plasma adjacent the exposed sides 34, 35 of the waveguide dielectric 30 will begin to function similarly to electrically conductive waveguide walls, and then the guided wave applicator will achieve steady state operation as described in the preceding paragraph.

The interior of a plasma chamber generally must be maintained at a pressure below atmospheric pressure in order to sustain a plasma. An important advantage of the invention is that, unlike certain prior art designs, the guided wave applicator 20 contains no gas at atmospheric pressure. Therefore, the invention does not require any vacuum seal or gas-tight seal around the guided wave applicator that must sustain the pressure differential between atmospheric pressure inside the seal and the high vacuum within the plasma chamber outside the seal. Instead, in the present invention the waveguide dielectric 30 is non-gaseous material that can be directly exposed to the plasma within the plasma chamber.

The invention is especially advantageous for use in plasma chambers for simultaneously processing two workpieces. As shown in FIG. 1, each guided wave applicator 20 preferably is positioned between the two workpiece positions 10, 11 and oriented so that the two exposed sides 34, 35 of the waveguide dielectric 30 respectively face the two workpiece positions 10, 11. Because the guided wave applicator 20 couples equal power to the plasma at the two exposed sides 34, 35 of the waveguide dielectric, the resulting plasma is symmetrical so that each workpiece is exposed to the same plasma density.

Although the orientation described in the preceding paragraph typically is preferable, the invention does not require any specific orientation of the guided wave applicator 20. For example, a guided wave applicator can be rotated 90 degrees along its longitudinal axis relative to the orientation shown in FIG. 1 so that each workpiece faces one of the waveguide walls 22, 23 rather than the waveguide dielectric. Furthermore, if there are multiple guided wave applicators, different guided wave applicators can have different orientations.

Preferably, the length of each guided wave applicator 20 (the dimension perpendicular to the page in FIGS. 1 and 2 and vertical on the page in FIGS. 3-5) is approximately equal to the width of the adjacent workpiece position 10, 11 along the same direction. This permits a single guided wave applicator to couple uniform microwave power to the plasma along the entire width of the workpiece along that direction.

In order to couple uniform microwave power to the plasma along the entire width of the workpiece in the direction perpendicular to the length of the guided wave applicator 20, a plurality of guided wave applicators preferably are spaced apart in the direction perpendicular to the waveguide walls 22, 23 of the guided wave applicators, as shown in FIG. 1. The resulting array of guided wave applicators can couple spatially uniform microwave power to the plasma adjacent the two workpiece positions 10, 11 on opposite sides of the array of guided wave applicators.

Optionally, to improve the spatial uniformity of the plasma process being performed on each workpiece, each workpiece or one or more of the guided wave applicators 20 can be moved while the plasma process is being performed. For example, if one or more guided wave applicators are between two workpiece positions 10, 11 as shown in FIG. 1, the direction of such movement can be perpendicular to the longitudinal axis of one of more guided wave applicators and parallel to a plane that is equidistant between the two workpiece positions. Movement in such direction would compensate for the difference between the relatively high plasma density adjacent the exposed sides 34, 35 of the guided wave applicators and the relatively low plasma density in the regions between the guided wave applicators.

As stated above in the "Summary of the Invention", a first aspect of the invention is a guided wave applicator apparatus 20 and method. A second aspect of the invention is a plasma chamber apparatus and a method of coupling electrical power to a plasma within such plasma chamber, wherein one or more guided wave applicators 20 are provided within the plasma chamber.

In the examples described above, the plasma chamber within which the one or more guided wave applicators 20 of the invention are positioned is a process chamber within which an electronic workpiece is fabricated. Alternatively, by way of example but not limitation, the one or more guided wave applicators 20 can be positioned within a plasma chamber that is a remote plasma source used for forming a plasma that is conveyed (i.e., flowed) to a process chamber in which the electronic workpiece is fabricated.

In other words, the plasma chamber of the second aspect of the invention—i.e., the plasma chamber within which the one or more guided wave applicators 20 are positioned—need not be a process chamber within which an electronic workpiece is fabricated. By way of example but not limitation, the plasma chamber of the invention alternatively can be a remote plasma source used for forming a plasma that is conveyed (i.e., flowed) to a process chamber in which the electronic workpiece is fabricated.

3. Centering Between Waveguide Walls and Dielectric

It is desirable to constrain the relative positions of the waveguide dielectric 30 and the waveguide walls so that the width D of the covered sides 32, 33 of the waveguide dielectric remains centered between the width W of the two waveguide walls 22, 23.

One means for maintaining such centering is to connect one or both of the two respective covered sides 32, 33 of the waveguide dielectric to its adjacent waveguide wall 22, 23, respectively. Preferably the connection is limited to an area near the center of one or both of the covered sides, thereby leaving an outer portion of the waveguide dielectric free to undergo thermal expansion and contraction.

More preferably, the connection can be a mechanical joint that permits relative movement between the waveguide dielectric 30 and the waveguide walls 22, 23 along a direction parallel to the longitudinal axis of the guided wave applicator 20 (in other words, parallel to the mutually parallel longitudinal axes of the waveguide dielectric and the waveguide walls).

Figure 5:
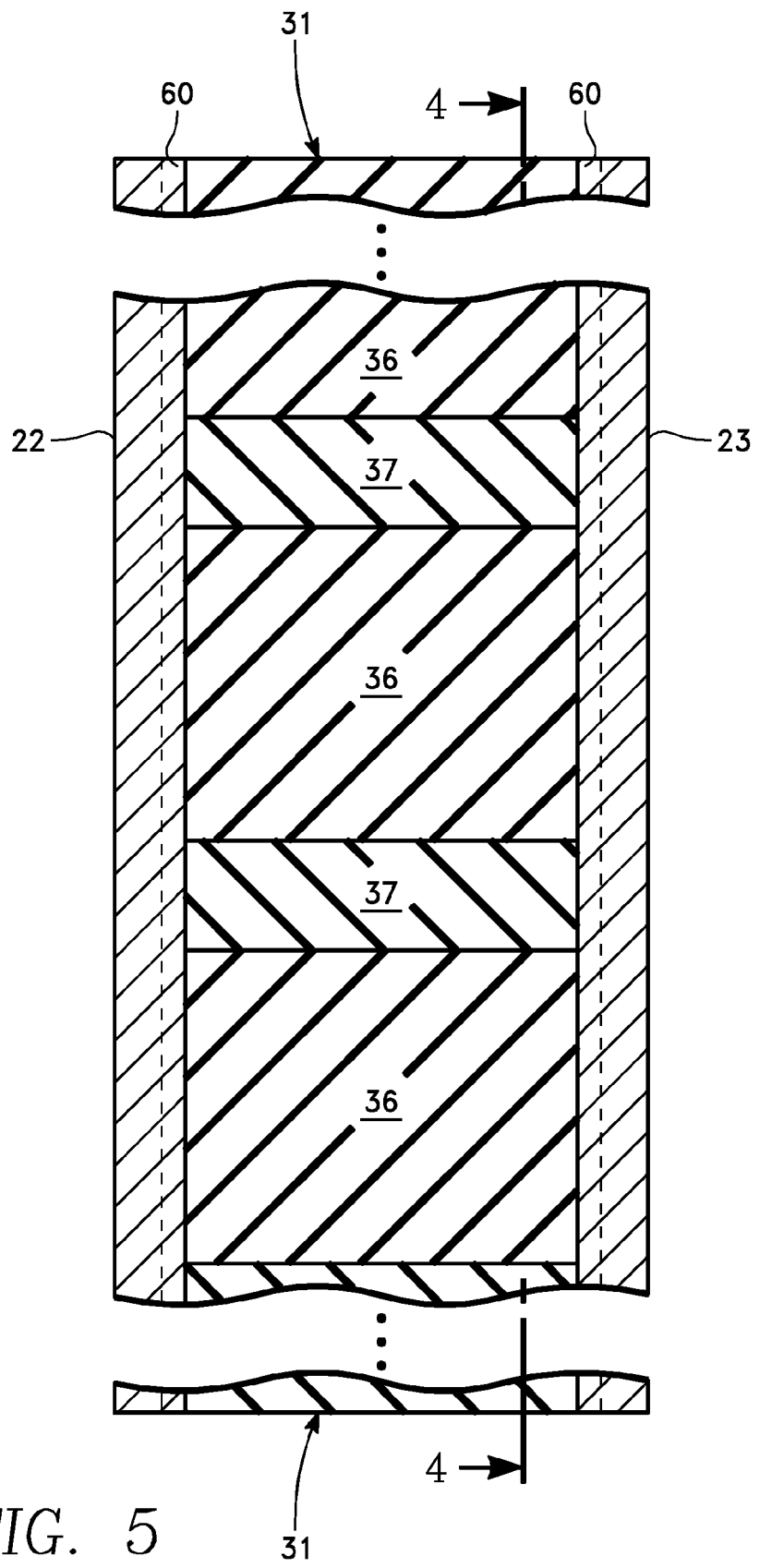
FIG. 5 is a sectional view of the guided wave applicator of FIG. 2, taken through a section plane extending through the tongue-in-groove joints between the waveguide dielectric and the two waveguide walls.

For example, the connection between the waveguide dielectric and the waveguide walls 22, 23 can be a tongue-in-groove joint extending parallel to the longitudinal axes of the waveguide dielectric and the waveguide walls. FIGS. 2 and 5 illustrate a tongue-in-groove joint 60 in which each waveguide wall includes a longitudinally-extending tongue that is mounted within a longitudinally-extending groove provided in the waveguide dielectric.

In an alternative embodiment shown in FIGS. 7 and 8, one or both of the waveguide walls 22, 23 include side flanges 28, 29 that wrap around the corners of the waveguide dielectric 30 so as to partially overlap the exposed sides 34, 35 of the waveguide dielectric adjacent such corners. In other words, one or both of the waveguide walls have a "U" shape such that the sides of the "U" constitute the flanges 28, 29 that overlap the adjacent end portions of the exposed sides 34, 35 of the waveguide dielectric. Such overlap constrains movement of the waveguide dielectric relative to the waveguide walls so that the width D of the covered sides 32, 33 of the waveguide dielectric remains centered between the width W of the two waveguide walls 22, 23.

As stated above, preferably at least half the surface area of each of the two exposed surfaces 34, 35 of the waveguide dielectric should not be covered by the waveguide walls 22, 23. More preferably, a side flange 28, 29 of a waveguide wall should not extend more than one-fourth of the distance to the opposite waveguide wall, so that the side flange does not cover more than one-fourth of the transverse width S of an exposed side 34, 35 of the waveguide dielectric.

The reason it is acceptable to cover a portion of the surface area of each exposed side 34, 35 of the waveguide dielectric is that the electric field component of the microwave power propagating within the dielectric is close to zero adjacent the waveguide walls 22, 23. Moreover, such electric field typically has a cosine distribution as a function of position in the transverse direction along the surface of each of the exposed sides 34, 35 of the waveguide dielectric. Therefore, most of the electrical power transfer between the guided wave applicator 20 and the plasma occurs adjacent the central half of each of the exposed surfaces 34, 35 of the waveguide dielectric, i.e., the portion of each of the exposed surfaces that is halfway between the two waveguide walls.

4. Reducing Thermal Stress

During operation of the plasma chamber, the plasma within the chamber transfers heat to the waveguide dielectric 30 and the waveguide walls 22, 23. When workpieces are being transferred into and out of the plasma chamber, the plasma is turned off, thereby allowing the waveguide dielectric and waveguide walls to cool off. The waveguide dielectric and waveguide walls typically will heat and cool at different rates so as to produce a time-varying temperature differential between the waveguide dielectric and the waveguide walls.

Preferably the waveguide walls 22, 23 include one or more cooling conduits 44 through which a flow of liquid or gas coolant is provided. A conventional temperature regulation system can maintain the coolant at a desired temperature so as to maintain the waveguide walls at a relatively constant, cool temperature.

It is more difficult to provide coolant to the waveguide dielectric 30, especially liquid coolant, because small cracks in the dielectric can cause leakage of the coolant. If coolant is provided to the waveguide walls 22, 23 but not to the waveguide dielectric, the waveguide dielectric typically will undergo thermal expansion relative to the waveguide walls during times when the plasma is present and will undergo thermal contraction relative to the waveguide walls when the plasma is turned off.

In response to time-varying temperature differentials between the waveguide dielectric and the waveguide walls, thermal stress typically will be produced within the waveguide dielectric and the waveguide walls if their respective adjacent surfaces are constrained from undergoing different amounts of thermal expansion. A moderate amount of thermal stress is acceptable, but excessive thermal stress can warp or crack the waveguide dielectric or the waveguide walls.

In one embodiment of the invention, such thermal stress is avoided by not providing any attachment between the waveguide dielectric 30 and the waveguide walls 22, 23, whereby relative movement is permitted between the waveguide dielectric and the waveguide walls.

More preferably, it is desirable to constrain the relative positions of the waveguide dielectric and the waveguide walls so that the width D of the waveguide dielectric 30 remains centered between the width W of the two waveguide walls 22, 23. As explained in the preceding section "3. Centering Between Waveguide Walls and Dielectric", such centering can be achieved by a mechanical joint that permits relative movement between the waveguide dielectric 30 and the waveguide walls 22, 23 along a direction parallel to the longitudinal axis of the guided wave applicator 20.

The waveguide dielectric 30 can be monolithic; i.e., it can be a single, solid bar.

Figure 3:
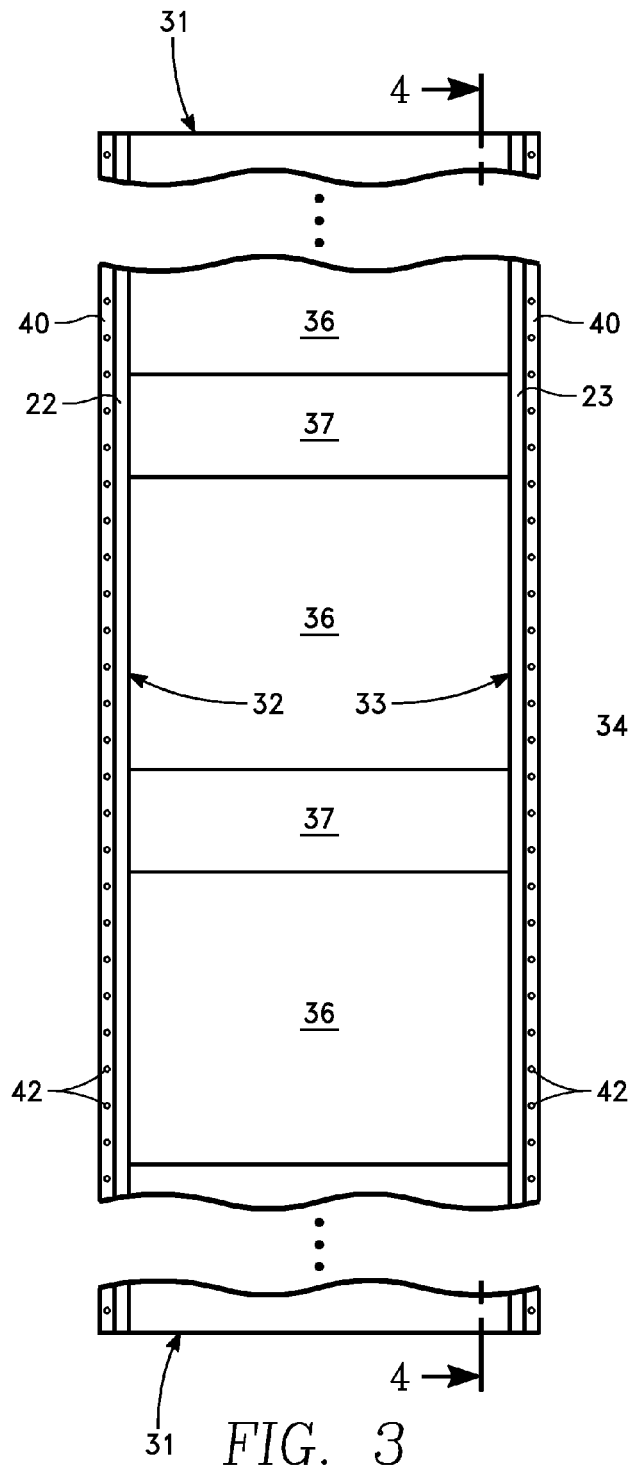
FIG. 3 is a side view of the guided wave applicator of FIG. 2, taken from the side of one of the exposed sides of the waveguide dielectric.
Figure 4:
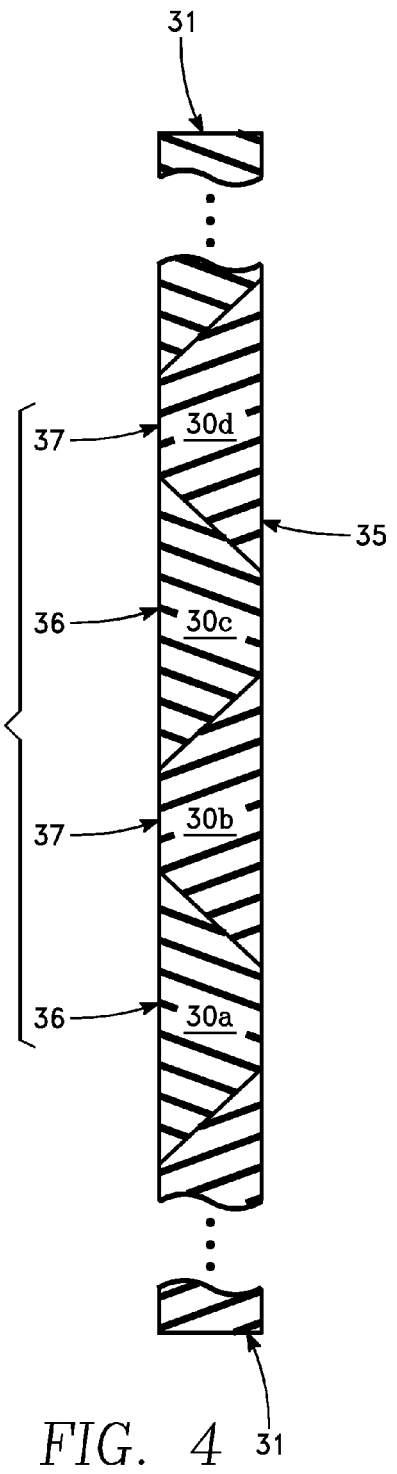
FIG. 4 is a sectional view of the guided wave applicator of FIG. 2, taken through a section plane parallel to and between the waveguide walls.

Alternatively, as illustrated in FIGS. 3-5, thermal stress can be further reduced or avoided if the waveguide dielectric 30 is not monolithic, but instead comprises multiple segments 30a, 30b, 30c, . . . that are not connected directly together and are distributed along the longitudinal dimension of the guided wave applicator, i.e., along the length dimension of the waveguide walls.

In one embodiment, the segments of the waveguide dielectric are not attached to the waveguide walls 22, 23, thereby permitting relative movement between the waveguide dielectric and the waveguide walls. More preferably, however, it is desirable to constrain the relative positions of the segments of the waveguide dielectric and the waveguide walls so that the width D of each segment 30a, 30b, 30c, . . . of the waveguide dielectric remains centered between the width W of the two waveguide walls 22, 23. One means for achieving this is to connect one or both of the two respective covered sides 32, 33 of each segment of the waveguide dielectric to its adjacent waveguide wall 22, 23, respectively. Such connection can be fixed or moveable.

The connection between each segment 30a, 30b, 30c, . . . and one or both of the waveguide walls 22, 23 can be at an area near the center of one or both of the covered sides of each segment, thereby leaving an outer portion of each segment free to undergo thermal expansion and contraction.

For example, each segment 30a, 30b, 30c, . . . of the waveguide dielectric can be a rectangular block (not shown). In that case, the segments will expand longitudinally as they are heated by plasma during operation of the plasma chamber. Conversely, when the plasma is turned off, the segments will thermally contract, which may result in small gaps between adjacent segments. Such gaps will have no adverse effect on the operation of the guided wave applicator provided they are too small to permit the formation of a plasma in the gaps. Dividing the waveguide dielectric 30 into a larger number of segments proportionately decreases the gap between adjacent segments.

FIGS. 3-5 show an alternative embodiment in which each segment 30a, 30b, 30c, . . . of the waveguide dielectric has a trapezoid shape. In this embodiment, each segment of the waveguide dielectric 30 has a transverse cross-section in the shape of a trapezoid when viewed from a plane parallel to the plane of the mutually facing surfaces 24, 25 of the waveguide walls. Successive segments 30a, 30b, 30c, . . . of the waveguide dielectric are oriented with their respective short base 37 facing opposite directions. In other words, one exposed side 34 of the waveguide dielectric 30 will alternately include the long base 36 and short base 37 of successive segments 30a, 30b, 30c, . . . as shown in FIG. 4.

Advantageously, this trapezoid shape minimizes thermal stress within the segments 30a, 30b, 30c, . . . of the waveguide dielectric 30 regardless of whether the segments are provided space to expand along the longitudinal axis of the guided wave applicator. For example, the segments can be tightly packed between the two longitudinal ends 31 of the waveguide dielectric 30 of the guided wave applicator. When the segments are heated by plasma, the segments expand laterally in a direction parallel to the plane of the mutually facing surfaces 24, 25 of the waveguide walls 22, 23—in other words, perpendicular to the page in FIGS. 3 and 5 or left-to-right on the page in FIG. 4.

Optionally, regardless of whether the segments have the trapezoidal shape just described, each segment 30a, 30b, 30c, . . . of the waveguide dielectric 30 can be connected to one or both of the waveguide walls 22, 23 by means of a mechanical joint that permits relative movement between the waveguide dielectric 30 and the waveguide walls 22, 23 along a direction parallel to the longitudinal axis of the guided wave applicator 20—in other words, along a direction parallel to the mutually parallel longitudinal axes of the waveguide dielectric and the waveguide walls. For example, the connection between each segment 30a, 30b, 30c, . . . and the waveguide walls 22, 23 can be a tongue-in-groove joint extending parallel to the longitudinal axis of the guided wave applicator. FIGS. 2 and 5 illustrate a tongue-in-groove joint 60 in which each waveguide wall includes a longitudinally-extending tongue that is mounted within a longitudinally-extending groove provided in each segment 30a, 30b, 30c, . . . of the waveguide dielectric.

5. Process Gas Conduit

In addition to, or instead of, the process gases being supplied to the interior of the plasma chamber through one or more process gas conduits 14-17, the waveguide walls 22, 23 can include process gas conduits 40 as shown in FIGS. 1 and 3. The process gas conduits 40 of each waveguide walls preferably have gas outlets 42 facing the closest one of the two workpiece positions 10, 11. If the guided wave applicators 20 are oriented as shown in FIG. 1, this means the gas outlets of the process gas conduits face in a direction perpendicular to the exposed sides 34, 35 of the waveguide dielectric.

Different process gases can be mixed together before they are supplied to the process gas conduits 14-17, 40. Alternatively, different process gases can be supplied through distinct process gas conduits. For example, one set of process gases can be supplied through the process gas conduits 14, 15 that are between adjacent guided wave applicators 20, and another set of process gases can be supplied through the process gas conduits 16, 17 that are between a respective guided wave applicator and an adjacent workpiece.

The number of process gas conduits 14-17, 40 shown in FIGS. 1 and 3 may be more than necessary to achieve a spatially uniform distribution of the constituents of the process gas in the plasma adjacent the workpieces. Consequently, any of the illustrated process gas conduits can be reduced in number or eliminated. For example, an embodiment may include only the process gas conduits 14, 15 that are between adjacent guided wave applicators 20; or only the process gas conduits 16, 17 that are between a respective guided wave applicator and an adjacent workpiece; or only the process gas conduits 40 in the waveguide walls.

The operation of the guided wave applicator 20 is independent of the means for dispensing gas into the plasma chamber. Therefore, none of the process gas conduits is a required element of the guided wave applicator invention.

6. Alternative Orientations and Asymmetry

The invention does not depend on the relative or absolute orientations of the guided wave applicators 20, the workpiece positions 10, 11, or the process gas conduits 14, 15.

For example, FIGS. 1-6 illustrate each guided wave applicator 20 as having its longitudinal axis oriented vertically, so that FIGS. 1 and 2 are top views and FIGS. 3 and 5 are side views. However, the guided wave applicators can be rotated 90 degrees so that each guided wave applicator has its longitudinal axis oriented horizontally. In that case, FIGS. 1 and 2 would be side views and FIGS. 3 and 5 would be top views.

Alternatively, one or more of the guided wave applicators 20 can be oriented at an acute angle relative to vertical or horizontal. They need not be coplanar, and they need not be parallel to each other or to the workpiece positions 10, 11.

Similarly, the workpiece positions 10, 11 can be oriented horizontally instead of vertically, in which case FIG. 1 would be a side view. Alternatively, the workpiece positions can be oriented at an acute angle relative to vertical or horizontal so that they are not parallel to each other or to the guided wave applicators.

For example, FIG. 6 shows the guided wave applicators 20 oriented vertically and the two workpiece positions 10, 11 tilted in opposite directions away from vertical. Each guided wave applicator 20 preferably is equidistant from the two workpieces.

Although the process gas conduits 14, 15 are illustrated in FIG. 1 as parallel to the guided wave applicators 20, the process gas conduits can have any orientation, regardless of the orientation of the guided wave applicators. For example, the process gas conduits can be oriented perpendicular to the guided wave applicators, so that the process gas conduits are oriented horizontally while the guided wave applicators are oriented vertically, or vice versa. Alternatively, one or more of the process gas conduits can be oriented at an acute angle relative to vertical or horizontal. The process gas conduits need not be parallel to each other or to the workpieces.

Neither the waveguide walls 22, 23 nor the waveguide dielectric 30 are required to be symmetrical. Although both waveguide walls are described above as having a width W, more generally they can have different widths. Likewise, the two covered sides 32, 33 of the waveguide dielectric can have different widths D1 and D2 rather than having the same width D, and the two exposed sides 34, 35 of the waveguide dielectric can have different widths S1 and S2 rather than having the same width S. In the latter case, it is preferred that each of S1 and S2 is greater than D1 and D2.

The invention claimed is:

1. A method for coupling electrical power to a plasma, comprising the steps of:
    providing a plasma chamber having an interior;
    providing first and second waveguide walls, wherein each waveguide wall is electrically conductive;
    providing within the interior of the plasma chamber a waveguide dielectric whose volume is composed of non-gaseous dielectric material, wherein the waveguide dielectric includes:
        (i) first and second longitudinal ends, and
        (ii) first, second, third and fourth sides that extend longitudinally between the two longitudinal ends; and
    coupling electrical power from an electrical generator to at least one of the longitudinal ends of the waveguide dielectric;
    wherein:
    the waveguide dielectric is positioned between the two waveguide walls;
    the first waveguide wall is positioned so that it covers the first side of the waveguide dielectric;
    the second waveguide wall is positioned so that it covers the second side of the waveguide dielectric; and
    a portion of each of the third and fourth sides of the waveguide dielectric is not covered by the waveguide walls and is exposed to the interior of the plasma chamber.

2. The method of claim 1, wherein:
    at least half the surface area of each of the third and fourth sides of the waveguide dielectric is not covered by the waveguide walls and is exposed to the interior of the plasma chamber.

3. The method of claim 1, wherein:
    at least half the surface area of each of the third and fourth sides of the waveguide dielectric is not covered by any electrically conductive solid object and is exposed to the interior of the plasma chamber.

4. The method of claim 1, wherein:
the first and second longitudinal ends of the waveguide dielectric are opposite each other;
the first and second sides of the waveguide dielectric are opposite each other; and
the third and fourth sides of the waveguide dielectric are opposite each other.

5. The method of claim 1, wherein:
the third and fourth sides of the waveguide dielectric have a greater transverse width than the first and second sides of the waveguide dielectric.

6. The method of claim 1, wherein:
the waveguide dielectric is shaped as a parallelepiped.

7. The method of claim 1, wherein:
each of the first and second sides of the waveguide dielectric has a planar surface; and
the first waveguide wall and the second waveguide wall each has a planar surface that covers the first side and the second side, respectively, of the waveguide dielectric.

8. The method of claim 1, further comprising the step of:
coupling electrical power from an electrical generator to at least one of the longitudinal ends of the waveguide dielectric.

9. The method of claim 1, further comprising the step of:
coupling microwave power from a microwave generator to at least one of the longitudinal ends of the waveguide dielectric.

10. The method of claim 1, wherein:
the waveguide dielectric is composed of a solid dielectric material.

11. The method of claim 1, wherein:
the waveguide dielectric consists of a monolithic, non-segmented dielectric material.

12. The method of claim 1, wherein:
the waveguide dielectric comprises a plurality of segments of dielectric material that are not connected directly together and that are distributed along the longitudinal dimension of the guided wave applicator.

13. The method of claim 1, wherein:
the waveguide dielectric comprises a plurality of segments of dielectric material that are not connected directly together; and
the segments are separated by gaps that are sufficiently small so as to prevent the formation of a plasma within the gaps in response to said electrical power.

14. The method of claim 1, wherein:
the waveguide dielectric comprises a plurality of segments of dielectric material that are not connected directly together and that are distributed along the longitudinal dimension of the guided wave applicator;
each segment has a transverse cross-section in the shape of a trapezoid having first and second legs, a short base, and a long base parallel to the short base, wherein the two legs respectively extend between the short base and the long base at respective acute angles relative to the long base;
the short base of each successive segment faces in opposite directions; and
the segments are sufficiently close together that the first leg of each segment overlaps the second leg of an adjacent one of the segments.

15. The method of claim 1, wherein:
the waveguide dielectric comprises a plurality of segments of dielectric material that are not connected directly together and that are distributed along the longitudinal dimension of the guided wave applicator;
each segment has a transverse cross-section in the shape of a trapezoid having a short base and a long base; and
the short base of each successive segment is mechanically connected to an alternate one of the two waveguide walls.

16. The method of claim 1, further comprising the step of:
providing a process gas conduit within a first one of the waveguide walls;
wherein the first waveguide wall has a surface exposed to the interior of the plasma chamber; and
the process conduit has a longitudinal axis parallel to said surface of the first waveguide wall and is coupled to a plurality of gas outlets at said surface of the first waveguide wall.

17. The method of claim 1, further comprising:
providing a tongue-in-groove joint between the first waveguide wall and the first side of the waveguide dielectric;
wherein the tongue-in-groove joint permits relative movement between the waveguide dielectric and the first waveguide wall along a direction extending between the first and second longitudinal ends of the waveguide dielectric.

18. The method of claim 1, wherein:
the first waveguide wall includes a first flange and a second flange;
the first flange covers a portion of the third side of the waveguide dielectric adjacent to the first side of the waveguide dielectric;
the second flange covers a portion of the fourth side of the waveguide dielectric adjacent to the first side of the waveguide dielectric; and
the first and second flanges permit relative movement between the waveguide dielectric and the first waveguide wall.

19. A method for coupling electrical power to a plasma, comprising the steps of:
providing one or more guided wave applicators within a plasma chamber, wherein each guided wave applicator comprises:
(i) first and second waveguide walls, wherein each waveguide wall is electrically conductive, and
(ii) a waveguide dielectric whose volume is composed of non-gaseous dielectric material, wherein the waveguide dielectric is positioned between the two waveguide walls, and wherein the waveguide dielectric includes first and second longitudinal ends and first, second, third and fourth sides that extend longitudinally between the first and second longitudinal ends; and
coupling electrical power from an electrical generator to at least one of the longitudinal ends of the waveguide dielectric of each guided wave applicator;
wherein, for each respective guided wave applicator:
the first waveguide wall of said respective guided wave applicator is positioned so that it covers the first side of the waveguide dielectric of said respective guided wave applicator;
the second waveguide wall of said respective guided wave applicator is positioned so that it covers the second side of the waveguide dielectric of said respective guided wave applicator; and
a portion of each of the third and fourth sides of the waveguide dielectric of said respective guided wave applicator is not covered by the waveguide walls of said respective guided wave applicator.

20. The method of claim 19, wherein:
for each respective guided wave applicator, at least half the surface area of each of the third and fourth sides of the waveguide dielectric of said respective guided wave applicator is not covered by the waveguide walls of said respective guided wave applicator.

21. The method of claim 19, wherein:
said one or more guided wave applicators comprise a plurality of guided wave applicators; and
the guided wave applicators are positioned within the plasma chamber such that their respective longitudinal axes are mutually parallel and such that they are spaced apart along a dimension perpendicular to their respective longitudinal axes.

22. The method of claim 19, further comprising:
a first workpiece support for supporting a first workpiece at a first workpiece position within the plasma chamber; and
a second workpiece support for supporting a second workpiece at a second workpiece position within the plasma chamber;
wherein one of the one or more guided wave applicators is positioned midway between the first and second workpiece positions.

23. The method of claim 19, further comprising:
a first workpiece support for supporting a first workpiece at a first workpiece position within the plasma chamber; and
a second workpiece support for supporting a second workpiece at a second workpiece position within the plasma chamber;
wherein said one or more guided wave applicators are positioned within a geometric plane that is midway between the first and second workpiece positions.

24. The method of claim 19, further comprising the steps of:
performing plasma processing of a workpiece within the plasma chamber;
moving the one or more guided wave applicators during said plasma processing.

25. The method of claim 19, further comprising the steps of:
supporting a workpiece on a workpiece support within the plasma chamber; and
moving the workpiece support during plasma processing of the workpiece within the plasma chamber.

26. A method for coupling electrical power to a plasma, comprising the steps of:
providing a guided wave applicator that comprises (a) first and second waveguide walls, wherein each waveguide wall is electrically conductive, and (b) a waveguide dielectric whose volume is composed of non-gaseous dielectric material, wherein the waveguide dielectric includes:
(i) first and second longitudinal ends, and
(ii) first, second, third and fourth sides that extend longitudinally between the two longitudinal ends; and
coupling electrical power from an electrical generator to at least one of the longitudinal ends of the waveguide dielectric;
wherein:
the waveguide dielectric is positioned between the two waveguide walls;
the first waveguide wall is positioned so that it covers the first side of the waveguide dielectric;
the second waveguide wall is positioned so that it covers the second side of the waveguide dielectric; and
a portion of each of the third and fourth sides of the waveguide dielectric is not covered by the waveguide walls and is exposed to the exterior of the guided wave applicator.

* * * * *